United States Patent [19]

Anthony et al.

[11] Patent Number: 5,451,430
[45] Date of Patent: Sep. 19, 1995

[54] METHOD FOR ENHANCING THE TOUGHNESS OF CVD DIAMOND

[75] Inventors: Thomas R. Anthony, Schenectady; James F. Fleischer, Scotia, both of N.Y.; Bradley E. Williams, Worthington, Ohio

[73] Assignee: General Electric, Worthington, Ohio

[21] Appl. No.: 238,543

[22] Filed: May 5, 1994

[51] Int. Cl.6 .............................................. B05D 3/02
[52] U.S. Cl. ................... 427/372.2; 427/249; 427/122; 423/446; 428/408
[58] Field of Search ...................... 427/249, 122, 372.2; 423/446; 156/DIG. 68; 428/408

[56] References Cited

U.S. PATENT DOCUMENTS 4,124,690  11/1978  Strong et al. .
4,174,380  11/1979  Strong et al. .
5,110,579   5/1992  Anthony et al. .

FOREIGN PATENT DOCUMENTS

2732211A1  7/1977  Germany .

OTHER PUBLICATIONS

"Graphitization of diamond at zero pressure and at a high pressure". By G. Davies and T. Evans, Proc. R. Soc. Lond. A. 328 (1972) pp. 413–427.
"Plastic Deformation and Work–Hardening of Diamond". by R. C. DeVries, Mat. Res. Bull. vol. 10, (1975), pp. 1193–1200.
Mori et al, "Surface Characteristics of synthesized diamond and the effect of surface treatment on surface transformations" Appl. Surf. Sci., 56–58) 1992, pp. 89–93.
Lewis et al, "High temperature graphitization of diamond", Proc. Electrochem. Soc., 91–8, 1991 pp. 455–462.

*Primary Examiner*—Roy V. King

[57] ABSTRACT

A stress relieved CVD diamond is produced by annealing said CVD diamond at a temperature above about 1100 to about 2200 degrees Centigrade in a non-oxidizing atmosphere at a low pressure or vacuum and for a suitable short period of time which decreases with increasing annealing temperature so as to prevent graphitization of said diamond.

17 Claims, 1 Drawing Sheet

METHOD FOR ENHANCING THE TOUGHNESS OF CVD DIAMOND

TECHNICAL FIELD OF THE INVENTION

The present invention relates to a process for enhancing the properties of low pressure chemical vapor deposited (CVD) diamond and the enhanced product resulting from such treatment.

BACKGROUND OF THE INVENTION

When diamond is chemically vapor deposited, large intrinsic tensile stresses are typically present. At the usual temperatures of CVD diamond deposition at 750 to 900 degrees Centigrade, diamond is a brittle material and will not plastically flow. As a result, these deposition stresses cannot relax. The presence of these stresses can be seen in polarized optical transmission microscopy. The initial layer of CVD diamond may relax some of this tensile stress by deforming the underlying substrate.

Increasing demands are being put on as-grown CVD diamond. For instance, windows must have the highest possible transmission of laser light. The presence of grain boundaries, defects, dislocations, plastic strain and other sources of density fluctuation within the diamond window reduce its transmission, increase its absorption of incident radiation and reduce its thermal conductivity, mechanical strength and mechanical toughness. Absorption of laser energy creates heat within the window which must be drained through the diamond body to an adjacent heat sink in contact with the diamond part. If heat dissipation is rate limiting, the temperature of the window will increase causing distortion of the window-fixture and failure of the entire window assembly.

Polycrystalline diamond films prepared by CVD methods suffer from visual and mechanical defects associated with grain boundaries and growth defects including voids. In addition, residual stresses associated with the growth processes may be undesirable. Subsequent use of CVD polycrystalline diamond films in tools, electro-optical applications, and so on may be inhibited by the presence of these defects. Hence, to improve the utilization of CVD diamond, it is desirable to enhance the desirable properties of the diamond by addressing the aforementioned problems.

BRIEF SUMMARY OF THE INVENTION

Thermal annealing may be utilized for reducing density fluctuations within an imperfect single- or polycrystalline body. However, with diamond, temperatures required to anneal it at reasonable rates are necessarily so high that the diamond crystal becomes thermodynamically unstable and spontaneously reverts to graphite. Graphitization usually occurs within the crystal body at defects, boundaries and microcracks, forming darkened regions within the body. This exacerbates density gradients and weakens the crystal which can crack and destroy the wafer. Heretofore, high temperature process for annealing CVD diamond so as to enhance the strength and desirable properties has not been adequately developed for CVD diamond.

According to a process as described in copending applications, U.S. Ser. No. 08/208,938, filed Mar. 11, 1994 and U.S. Ser. No. 08/238,544, filed May 5, 1994, both entitled Toughened Chemically Vapor Deposited Diamond by Anthony et al, stresses can be relieved by placing the CVD diamond in a hydrostatic environment in a high pressure/high temperature cell and exposing it to temperatures in the range of 1100° to 17700° C. and pressures of 45 to 70 kilobars. It is believed that the effects of this process are largely confined to plastic flow of the diamond.

Hence, a desirable advance in the art is to achieve enhanced stress reduction as set forth in the above application and avoid deleterious effects of graphitization which typically occurs during high temperature treatment of diamond, while avoiding the use of high pressures which are uneconomical.

In accordance with the present invention, there is provided a process for stress relieving CVD diamond comprising annealing said CVD diamond at a temperature of above about 1100 to about 2200 degrees Centigrade in a non-oxidizing atmosphere at a low pressure and for a suitable short period of time which decreases with increasing annealing temperature so as to prevent graphitization of said diamond.

DETAILED DESCRIPTION

Figure 1:
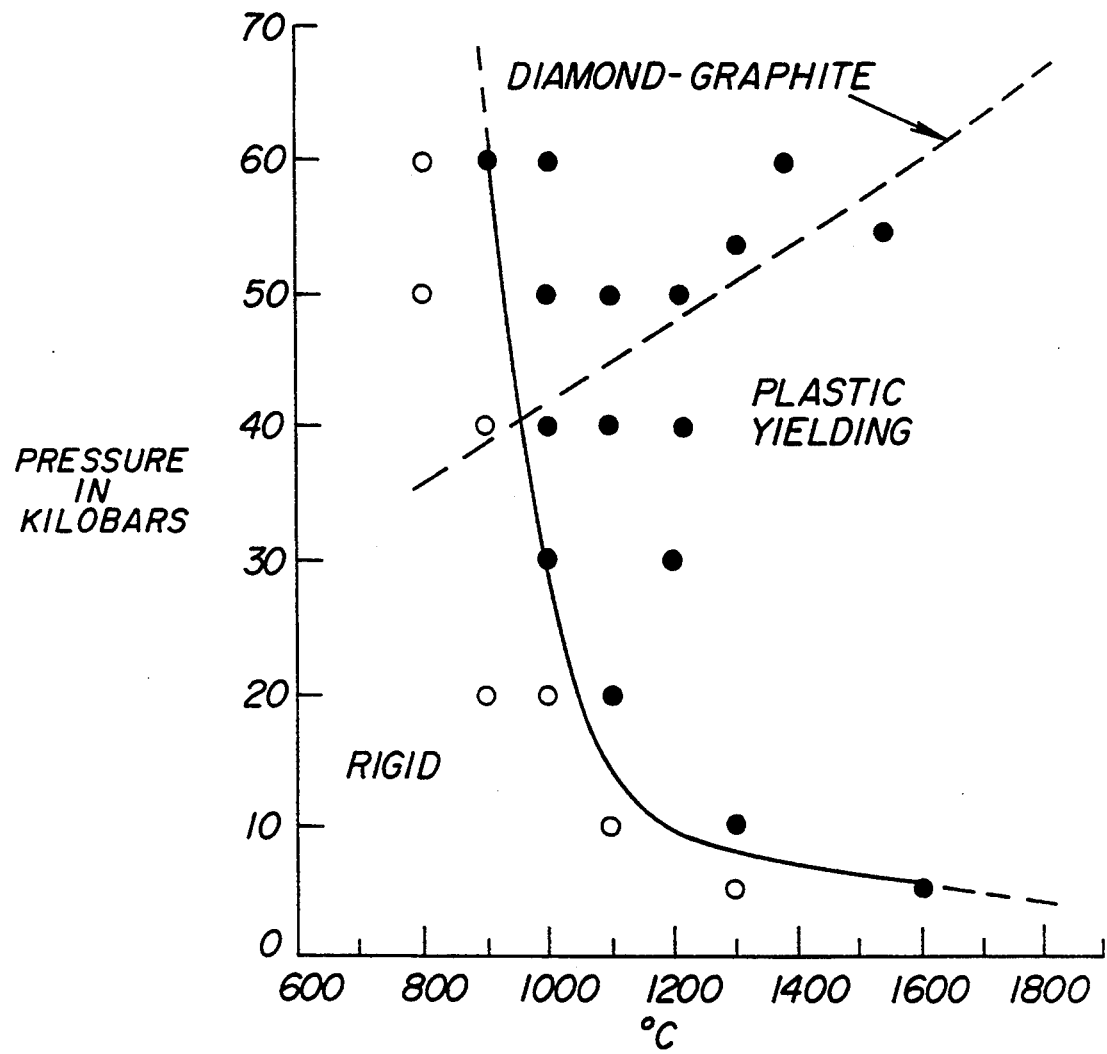
FIG. 1 shows a graph of the yield strength of diamond versus temperature (P-T line), and the DIAMOND-GRAPHITE line from DeVries, Mat. Res. Bull., 10, 1193–1200 (1975).

A CVD diamond having enhanced properties characterized by reduced residual stress is formed by a post treatment of a starting low pressure produced CVD diamond. The starting CVD diamond utilized in the process of the present invention is a CVD diamond made by processes known in the art. Typically, processes for producing low pressure CVD diamond comprise microwave CVD, RFCVD, DCjet CVD, combustion flame CVD, or filament. A filament process for forming a CVD diamond substrate is set forth in U.S. Pat. No. 5,110,579 to Anthony et al. According to the processes set forth in the patent, diamond is grown by chemical vapor deposition on a substrate such as molybdenum by passing an appropriate mixture containing hydrogen and methane over a filament for an appropriate length of time to deposit a diamond film of the desired thickness.

It has been found that CVD deposited diamond films are prone to deleterious stresses which detract from the final desirable properties of the diamond. The process of the present invention may enhance CVD diamond with thicknesses of greater than 50 microns. When used as free-standing films, thicknesses greater than 200 microns are preferred for certain applications.

A preferred starting film as described in the above patent is substantially transparent columns of diamond crystals having a <110>,<100>or <111> orientation perpendicular to the base. Grain boundaries between adjacent diamond crystals having hydrogen atoms saturating dangling carbon bonds is preferred wherein at least 50 percent of the carbon atoms are believed to be tetrahedrally bonded based on Raman spectroscopy, infrared and X-ray analysis. It is also contemplated that H, F, Cl, O or other atoms may saturate dangling carbon atoms.

Preferably the starting CVD diamond films are produced by a process in which the amount of impurities is at a very low level and the diamond CVD film consists entirely of diamond. Additional ingredients in the form of impurities and intentional additives are preferably present in amounts less than 4000 parts per million by weight, and more preferably less than 100 parts per million. The low level of impurities contributes to enhanced properties of the final CVD diamond having reduced density gradients.

The crystal size of the starting CVD diamond may vary greatly and is dependent on the nucleation of diamond. For example, with heteroepitaxy or homoepitaxy, single crystals of CVD diamond may be grown. With continued nucleation during the deposition process, submicron crystals of diamond may be attained. When the nucleation is limited to an initial nucleation at the substrate, elongated diamond crystals up to but having a length of less than the thickness of the film formed.

The starting CVD diamond film preferably has a thermal conductivity of at least about 6 W/cm−K, more preferably at least about 9 W/cm−K, and most preferably at least about 12 W/cm−K. Thermal conductivity of the diamond film may be as high as about 21 W/cm−K, and 33 W/cm−K for isotopically pure diamond. Techniques which can be used to measure thermal conductivity of the substantially transparent diamond film are by Mirage, shown by R. W. Pryor et al., proceedings of the Second International Conference on New Diamond Science and Technology, p 863 (1990).

The starting CVD diamond film preferably has good optical properties and can transmit light. These properties are preferred for producing a high quality CVD diamond having reduced density gradients. The polycrystalline nature of diamond can result in light scatter which can interfere with clarity. In addition, a material of high refractive index can reflect incident light which also contributes to a reduction in transmittance. Hence, a starting CVD diamond having desirable clarity and refractive index is preferred.

FIG. 1 shows a graph of the yield strength of diamond versus temperature that was found by R. C. DeVries, Mat. Res. Bull., previously referred to. At the deposition temperatures of CVD diamond in the range of 750°–900° C., diamond is a brittle material that is not capable of plastically yielding. However, if the temperature is increased to a range above 1100° C., the yield strength of diamond decreases rapidly by over a factor of 10X. Thus, if CVD diamond is heated briefly into this range, the large deposition stresses can relax as plastic flow takes place and 90% of the stresses in CVD diamond can be eliminated.

During the high-temperature anneal, graphitization of diamond must be prevented while plastic flow is occurring. Hydrogen gas can be used as an extended surface graphitization suppressor in place of high pressure. Hydrogen allows single crystal diamond to be brought to temperatures as high as 2200° C. for short anneals. However, because graphitization can also occur on internal grain boundaries not accessible to the hydrogen ambient, the annealing time at temperature must be limited to the time given in Equation (1), subsequently set forth. A carbon containing gas such as methane can be added to the hydrogen to make the chemical potential of carbon in the gas equal to that of graphite. This will prevent hydrogen etching of the CVD diamond during the anneal. The gas pressure can vary between 1 torr to several atmospheres. Preferred pressures are less than 5 atmospheres, more preferably less than 3 atmospheres. For economical reasons sub-atmospheric pressures are not desirable so that preferred pressures are greater than about 0.5 atmosphere.

Alternatively, an inert atmosphere such as argon, neon or helium or a hard vacuum can be used instead of hydrogen. Again, the inert gas pressure is preferably in the range of 1 torr to several atmospheres. In these latter environments, the annealing time at temperature should be limited to prevent graphitization. To prevent graphitization at 1800° C., the annealing time must be less than 6 minutes. At 1850° C., the maximum annealing time is 1–4 minutes and at 1900° C. the maximum annealing time is 15 seconds. The advantage of using a higher temperature in each case is that the residual stresses in the CVD diamond are less because the plastic yield stress of diamond is a decreasing function of temperature as shown in FIG. 1. Preferably, the temperature is greater than 1600, and more preferably greater than 1800 degrees Centigrade. We can express the maximum time t(T) allowable for an anneal at a temperature T before graphitization of the CVD diamond will start as:

$$t(T) = 1.27 \times 10^{-26} \exp[127{,}328/T] \text{minutes} \quad (1)$$

where T is the absolute temperature of the anneal in degrees Kelvin and t(T) is in units of minutes.

The following Table sets forth the maximum annealing time at temperature for low pressure anneal to avoid graphitization.

| Temperature °C. | Temperature °K. | Time (minutes) |
|---|---|---|
| 1100 | 1373 | 0.239E + 15 |
| 1200 | 1473 | 0.441E + 12 |
| 1300 | 1573 | 0.181E + 10 |
| 1400 | 1673 | 0.144E + 08 |
| 1500 | 1773 | 0.196E + 06 |
| 1600 | 1873 | 0.424E + 04 |
| 1700 | 1973 | 0.135E + 03 |
| 1800 | 2073 | 0.601E + 01 |
| 1900 | 2173 | 0.356E + 00 |
| 2000 | 2273 | 0.270E − 01 |
| 2100 | 2373 | 0.255E − 02 |
| 2200 | 2473 | 0.291E − 03 |
| 2300 | 2573 | 0.394E − 04 |
| 2400 | 2673 | 0.619E − 05 |
| 2500 | 2773 | 0.111E − 05 |
| 2600 | 2873 | 0.225E − 06 |
| 2700 | 2973 | 0.506E − 07 |
| 2800 | 3073 | 0.125E − 07 |

As an example, we have annealed a CVD diamond sample at 1600° C. for ten minutes in a hard vacuum without any graphitization. The stress relief was examined by optical transmission micrographs in polarized. An uannealed CVD diamond film and an annealed film were compared. The stresses present in the unannealed film cause birefringence in the diamond and an active multicolored pattern. After the anneal, the absence of stresses greatly reduced the birefringence in the CVD diamond and the sample looks uniform in polarized light.

The stress relief in the sample was also apparent by the strain that occurred in the sample during the anneal. Free-standing CVD diamond contains a stress gradient with the final growing surface in tension and the initial growing surface in compress/on. During the anneal to relieve these stresses, the free-standing film strained into a curved shape with the final growth surface being the concave surface and the initial growth surface being the convex surface. To prevent curling of CVD samples during stress anneals, the sample can be placed between two inert refractory planar surfaces that are bolted in place. Examples of such inert refractory materials that are rigid at the anneal temperature include graphite, Mo, W, Nb, Ti, Zr, boron nitride, SiC, MgO, $Al_2O_3$ and other such materials. At the temperature of the anneal, plastic flow of the diamond will release the stresses in the film while the inert planar surfaces will keep the film flat. Because the stresses are released while the film is held flat, the film on release from these constraints after the anneal will remain flat.

A simple economical means of annealing CVD diamond is to place the diamond inside a enclosed graphite container that is heated either by RF in an evacuated quartz tube (the means selected for the example above) or placed into a conventional furnace in an evacuated container. Alternatively, the CVD diamond can be placed inside a metal, graphite or SiC heater tube or the like which is raised to the annealing temperature by Joule heating inside an evacuated vessel or a vessel filled with one of the gases mentioned above. By placing the CVD diamond in a heating tube or heated container, Laplace's Equation of Heat Flow insures that the CVD diamond is heated isothermally during its anneal. Isothermal heating avoids thermal stresses that could develop if there were non-linear thermal gradients in the CVD diamond during the anneal.

Upon removal of the diamond parts from the high temperature anneal, they are ready for fabrication into optical, acoustic, or thermomechanical or mechanical devices by dicing, polishing or hole drilling by laser or mechanical means or to be implemented in whatever application they were originally intended.

As an alternative to the method described above, it may be desirable to shape, polish, or otherwise finish the diamond parts and then subsequently anneal. As an alternative to the method described above, annealing of three dimensional parts such as tubes, nozzles, beads, bearings, hemispheres, or other unusually shaped components may take place. In addition, shaping of the CVD diamond may be accomplished by application of pressure while under plastic file conditions. For example, this method could be used to fabricate a cover part by annealing in a fixture with the desired final shape.

The present invention contemplates any sequence of events commencing with CVD diamond, and completion of part fabrication, in which one or more intermediate steps the treatment of the present invention takes place. The polishing, shaping and dicing sequence can occur in any order at the convenience of the processor.

The present invention also contemplates improving the properties of other types of diamond parts, including single and polycrystalline diamond, specifically including diamond wire dies, tools and wear parts including friction-reducing diamond surfaces, diamond windows, heat sinks, diamond electronic components including those doped at annealing conditions, diamond grit for saws, drills and grinding tools.

For wire die applications, it is desirable to utilized a high purity starting non-opaque CVD diamond so that the final product will have desirable properties. Since the annealed diamond resulting from the process of the present invention has a purity and other characteristics dependent on the starting diamond material, it is preferable to use a starting diamond with certain desirable characteristics so that the final annealed diamond may be used in applications requiring high quality diamond. Typically, the thickness of the starting CVD diamond for preferred applications is from 0.2 to 10 millimeter, preferably from 0.3 to 1.2 millimeters. Preferred optical properties include an absorbance of less than about 1.6 $cm^{-1}$ when using light having a wavelength in the range between about 300 to 1400 nanometers. Over this range, the absorbance decreases linearly from about 1.6 to 0.2 $cm^{-1}$ as the wavelength increases from 300 to 1400 nanometers. The absorbance decreases from 0.2 to less than 0.1 $cm^{-1}$ as the wavelength increases from about 1400 nm to about 2400 nm.

As previously discussed, a preferred starting CVD diamond for optical applications typically has crystals with a <110>, <100>, or <111> orientation perpendicular to the bottom surface. It is contemplated that the diamond grains may have a random orientation both parallel and perpendicular to the bottom surface. If the grain size of the CVD diamond is sufficiently small, random crystallographic orientations may be obtained. A preferred starting CVD diamond film for optical applications has the properties described above including grain boundaries between adjacent diamond crystals having hydrogen atoms saturating dangling carbon bonds as illustrated in the patent. Preferably, the starting CVD diamond has a hydrogen concentration of less than 2000, preferably less than 900 ppm. The concentrations of hydrogen in atomic per cent are typically from 10 ppm to about 1000 ppm, preferably from about 10 ppm to 500 ppm. A preferred starting diamond body has no voids greater than 20 microns, and preferably no greater than 10 microns in diameter or inclusions of another material or carbon phase.

A preferred starting CVD diamond film for optical applications is non-opaque or transparent or translucent and may contain oxygen in atomic percent greater than 1 part per billion. Undesirable impurities in the form of catalyst material, such as iron, nickel, or cobalt are preferably present in amounts less than 10 parts per million in atomic per cent. These impurities are typically associated with competing high-pressure high-temperature diamond synthesis processes. Nitrogen may be present in the CVD diamond film in atomic per cent from between 0.1 to 1000 parts per million.

When preferred starting CVD diamond films are produced by deposition on substrates made of Si, Ge, Nb, V, Ta, Mo, W, Ti, Zr or Hf, by neutron activation analysis, we have found that small amounts of these substrate materials are incorporated into the CVD diamond films made on these substrates. Hence, the film may contain greater than 10 parts per billion and less than 10 parts per million of Si, Ge, Nb, V, Ta, Mo, W, Ti, Zr or Hf. Additionally, the film may contain more than one part per million of a halogen, i.e. fluorine, chlorine, bromine, or iodine. Additional additives may include N, B, O and P which may be present in the form of intentional additives. These latter materials may be added as intentional additives to during CVD deposition such as by microwave diamond forming processes.

By way of further explanation, boron can be an intentional additive that is used to reduce intrinsic stress in the CVD diamond film or to improve the oxidation resistance of the film. Typically boron may present in atomic per cent from between 1-4000 ppm. Preferably additives such as N, S, Ge, Al and P, are each present at levels less than 100 ppm. It is contemplated that suitable films may be produced at greater levels. Lower levels of impurities tend to favor desirable properties of toughness and wear resistance. The most preferred films contain less than 5 parts per million and preferably less than 1 part per million impurities and intentional additives. In this regard, hydrogen, and oxygen are not regarded as intentional additives or impurities since these ingredients are the result of the process. As previously set forth, the present invention contemplates production of such high purity starting CVD diamond by a variety of techniques such as microwave CVD, RFCVD, DCjet CVD, or combustion flame CVD.

We claim:

1. A process for stress relieving CVD diamond comprising annealing said CVD diamond at a temperature of above about 1600 to about 1900 degrees Centigrade in a gaseous non-oxidizing atmosphere at a pressure less than about 5 atmospheres and for a period of time which decreases with increasing annealing temperature from a time of less than about 10 minutes at a temperature of about 1600 degrees to a time of less than about 15 seconds at about 1900 degrees for preventing excessive graphitization of said diamond.

2. A process for stress relieving CVD diamond according to claim 1 wherein said non-oxidizing atmosphere comprises hydrogen.

3. A process for stress relieving CVD diamond according to claim 1 wherein said non-oxidizing atmosphere is at a pressure of less than about 5 atmospheres.

4. A process for stress relieving CVD diamond according to claim 1 wherein said non-oxidizing atmosphere comprises a carbon containing gas.

5. A process for stress relieving CVD diamond according to claim 1 wherein said non-oxidizing atmosphere comprises argon, neon, helium, or vacuum.

6. A process for stress relieving CVD diamond according to claim 1 wherein said time period for annealing is approximated by the formula:

$$t(T) = 1.27 \times 10^{-26} \exp[127,328/T] \text{minutes}$$

where T is the absolute temperature of the anneal in degrees Kelvin and t(T) is in units of minutes.

7. A process for stress relieving CVD diamond according to claim 1 wherein the temperature for annealing is from about 1800 to about 1850 degrees Centigrade for a period of time which decreases with increasing annealing temperature from a time of less than about 6 minutes at a temperature of about 1800 degrees to a time of about 4 minutes at about 1850 degrees.

8. A process for stress relieving CVD diamond according to claim 1 wherein said CVD diamond prior to said annealing comprises a starting diamond and said annealing produces a resulting annealed CVD diamond having stresses as evidenced by the reduction of birefringence.

9. A process for stress relieving CVD diamond according to claim 1 comprising wherein said resulting annealed CVD diamond has reduced stresses as evidence of uniformity when viewed in polarized light.

10. A process for stress relieving CVD diamond according to claim 8 wherein said starting diamond is grown by chemical vapor deposition on a substrate from a gaseous mixture containing hydrogen and a carbon source passed over a filament for an appropriate length of time to form said starting diamond.

11. A process for stress relieving CVD diamond according to claim 8 wherein said starting diamond comprises substantially transparent columns of diamond crystals having a <110>,<100> or <111> orientation perpendicular to the base.

12. A process for stress relieving CVD diamond according to claim 8 wherein said starting diamond has grain boundaries between adjacent diamond crystals having substantially saturated dangling carbon bonds.

13. A process for stress relieving CVD diamond according to claim 5 wherein said chemical vapor deposition comprises a mixture comprising hydrogen, oxygen, and carbon.

14. A process for stress relieving CVD diamond according to claim 8 wherein said starting diamond comprises impurities or intentionally additives in amounts less than less than 4000 parts per million.

15. A process for stress relieving CVD diamond according to claim 8 wherein said starting diamond comprises diamond having a grain size of crystals of less than the film thickness.

16. A process for stress relieving CVD diamond according to claim 8 wherein said starting diamond comprises impurities or intentionally additives in amounts less than less than 100 parts per million.

17. A process for stress relieving CVD diamond according to claim 8 wherein said starting diamond comprises a single-crystal diamond.

* * * * *